United States Patent [19]

Knauer et al.

[11] 4,231,002
[45] Oct. 28, 1980

[54] TRANSVERSAL FILTER HAVING PARALLEL INPUTS

[75] Inventors: Karl Knauer, Kirchseeon; Hans-Joerg Pfleiderer, Zorneding, both of Fed. Rep. of Germany

[73] Assignee: Siemens Aktiengesellschaft, Berlin & Munich, Fed. Rep. of Germany

[21] Appl. No.: 17,242

[22] Filed: Mar. 5, 1979

[30] Foreign Application Priority Data

Mar. 31, 1978 [DE] Fed. Rep. of Germany ....... 2814053

[51] Int. Cl.$^2$ .................... H03H 7/28; H03H 7/10; H03K 5/156; G11C 19/28
[52] U.S. Cl. .................... 333/165; 307/221 D; 333/166; 333/173
[58] Field of Search ........... 307/221 D, 221 C, 221 R; 333/165, 166, 173; 357/24; 364/824-827

[56] References Cited

U.S. PATENT DOCUMENTS

| | | | |
|---|---|---|---|
| 3,979,582 | 9/1976 | Mims | 364/825 |
| 4,035,628 | 7/1977 | Lampe et al. | 307/221 D |
| 4,163,957 | 8/1979 | Knauer et al. | 333/165 |

FOREIGN PATENT DOCUMENTS 2643704 3/1978 Fed. Rep. of Germany.
2644284 4/1978 Fed. Rep. of Germany.

OTHER PUBLICATIONS

Knauer et al.-"Parallel-in/Serial-out: A new Approach For C.C.D. Transversal Filters" in Electronics Letters 3 Mar. 1977, vol. 13, No. 5, pp. 126-127.
Baba et al.-"A New Weighting Method for Analog Sampled Filter" in Japanese Journal of Applied Physics, vol. 16 (1977) Supplement 16-1; pp. 387-390.
Sakaue et al.-"An Input-Weighted CCD Transversal Filter" in Japanese Journal of Applied Physics, vol. 16 (1977) Supplement 16-1; pp. 391-396.
Séquin et al.-"Charge Transfer Devices" Academic Press, New York, 1975; pp. 1-18 and 48-50.

Primary Examiner—Marvin L. Nussbaum
Attorney, Agent, or Firm—Hill, Van Santen, Steadman, Chiara & Simpson

[57] ABSTRACT

A transversal filter is disclosed in which the stages of an analog charge transfer device shift register, integrated on a doped semiconductor substrate, are provided with parallel inputs and evaluation circuits preconnected to the parallel inputs. The evaluation circuits respectively exhibit an area doped opposite to the substrate, a first input gate and a second input gate and a transfer gate, whereby the transfer gate is arranged immediately next to the transfer channel of the charge transfer device shift register. The one input gate is connected to an input signal, the other input gate is connected to a constant direct voltage, the oppositely doped area is connected to a first clock pulse voltage and the transfer gate is connected with a second clock pulse voltage. The output signal can be tapped at an output of the charge transfer device shift register. Comparators are provided having first inputs connected with a counter which is loaded with clock pulses and second inputs connected with digital memories. The outputs of the comparators are connected to the gate circuits which block the evaluation circuits to one of the supply clock pulse voltages as a function of the respective comparison results between the counter signal, on the one hand, and the digital signals input into the memories, on the other hand.

12 Claims, 6 Drawing Figures

TRANSVERSAL FILTER HAVING PARALLEL INPUTS

BACKGROUND OF THE INVENTION

1. Field of the Invention

The present invention relates to a transversal filter in which the stages of an analog charge transfer device shift register, integrated on a doped semiconductor substrate, are provided with parallel inputs and evaluation or weighting networks connected to the parallel inputs, and more particularly to such a filter in which the evaluation circuits respectively exhibit an area doped opposite to the substrate, first and second input gates and a transfer gate, wherein the transfer gate is arranged directly adjacent the transfer channel of the charge transfer device shift register, the one input gate is connected to receive an input signal, the other input gate is connected to a constant direct current, the oppositely doped area is connected to a first clock pulse voltage and the transfer gate is connected to a second clock pulse voltage, and in which the output signal can be tapped at an output of the charge transfer device shift register.

2. Description of the Prior Art

A transversal filter, of the type generally mentioned above, is known from the periodical "Electronics Letters," Vol. 13, No. 5, Mar. 3, 1977, pp. 126–127. The magnitude of the individual coefficients with which the input signal is individually evaluated at each parallel input, thereby, is provided by means of the capacitance of the second input gate. Transversal filters of this species also form the subject matter of the German patent application No. P 26 43 704.7.

From the "Proceedings of the 8th Conference (1976 International) on Solid State Devices," Tokyo, 1976, published in the "Japanese Journal of Applied Physics," Vol. 16, (1977) Supplement 16-1, pp. 387–390, a transversal filter of this general type is known in which a charge shift device (CCD) shift register exhibits a plurality of transfer channels isolated from one another by means of separation diffusions, the channels being respectively individually allocated to the parallel inputs. Hereby, the transfer gate respectively provided in the evaluation circuits consist of the first shift electrode of the appertaining transfer channel. The transfer channels are brought together in a common output stage in whose area the aforementioned separation diffusions are omitted. At that point, a summing of the signal portions separately transmitted by way of the channels and arriving with varying delays takes place to form an output signal. The evaluation coefficients with which the signal supplied to the parallel inputs is applied are given by means of the gate surfaces in the individual evaluation circuits. It is, therefore, disadvantageous that the required semiconductor surface greatly increases with the plurality of the parallel inputs.

From the aforementioned article printed in the "Japanese Journal of Applied Physics," Vol. 16 (1977), Supplement 16-4 1, pp. 391–396, a further transversal filter is known which differs from the initially-mentioned species by means of a different design of the evaluation circuits and of the parallel inputs. Here, each individual evaluation circuit contains two metal-oxide-semiconductor (MOS) field effect transistors connected in series and a resistance diffusion, whereas each parallel input has a stage provided with an input diffusion, the stage being of a four-phase CCD shift register. The input diffusion is connected with a connection of the resistor and the last shift electrode is arranged adjacent to a shift electrode of a CCD shift register undertaking the summation of the signal parts. The gate of the one MOS field effect transistor of each evaluation circuit is connected with the input signal, the gate of the respectively other MOS transistor is connected with a constant current which determines the current flowing through the transistor and, therefore, the respective evaluation coefficients by means of its magnitude. Therewith, the transmission properties of the transversal filter can be electrically adjusted. However, it is disadvantageous that the current is a linear function of the constant voltage only in a small fluctuation range.

In a transversal filter of the type initially mentioned, it has already been proposed, cf. the earlier German patent application No. P 26 44 284.2, to form, for realizing an evaluation coefficient, charge amounts respectively twice in succession in the individual evaluation circuits and to input the same into the appertaining stages of the charge transfer device (CTD) shift register in order to be able to design the evaluation circuits in an economical space-saving manner.

SUMMARY OF THE INVENTION

The object of the present invention, therefore, is to provide a transversal filter of the type mentioned above whose evaluation coefficients can be electrically adjusted with great precision, whereby a large, relative adjustment range is to be covered.

This object is achieved in a transversal filter of this type in that comparators are provided whose first inputs are connected with a counter which is driven by clock pulses and whose second inputs are connected with digital memories, the outputs of the comparators being connected to gate circuits which block the evaluation circuits to one of the supply clock pulse voltages as a function of the respective comparison results between the counter signal, on the one hand, and the digital signals input into the memories, on the other hand. A particular advantage is achieved by practicing the present invention in that, by means of the stored digital signals, it is fixed in a very clear manner how often an amount of charge provided by means of the surface of an evaluation circuit is input from an evaluation circuit into the appertaining stage of the CTD shift register, whereby the evaluation coefficients assigned to the evaluation circuits follow from the plurality of the respectively input amounts of charge. Since the inputting of the amounts of charge can take place with a significantly higher frequency than the clock pulses of the CTD shift register, it is possible to provide large, relative adjustment ranges for the evaluation coefficients, which ranges, for example, include proportions in size of 1:1000 or more. Thereby, a linear dependency exists between the magnitude controlling the adjustment of an evaluation coefficient, i.e. the input digital signal, and the adjusted evaluation coefficient. The simple adjustability of the evaluation coefficients, which is provided within wide limits, makes it possible to provide a many-faceted employment of a transversal filter constructed in accordance with the invention.

BRIEF DESCRIPTION OF THE DRAWINGS

Other objects, features and advantages of the invention, its organization, construction and mode of operation will be best understood from the following detailed description, taken in conjunction with the accompanying drawings, on which.

DESCRIPTION OF THE PREFERRED EMBODIMENTS

Figure 1:
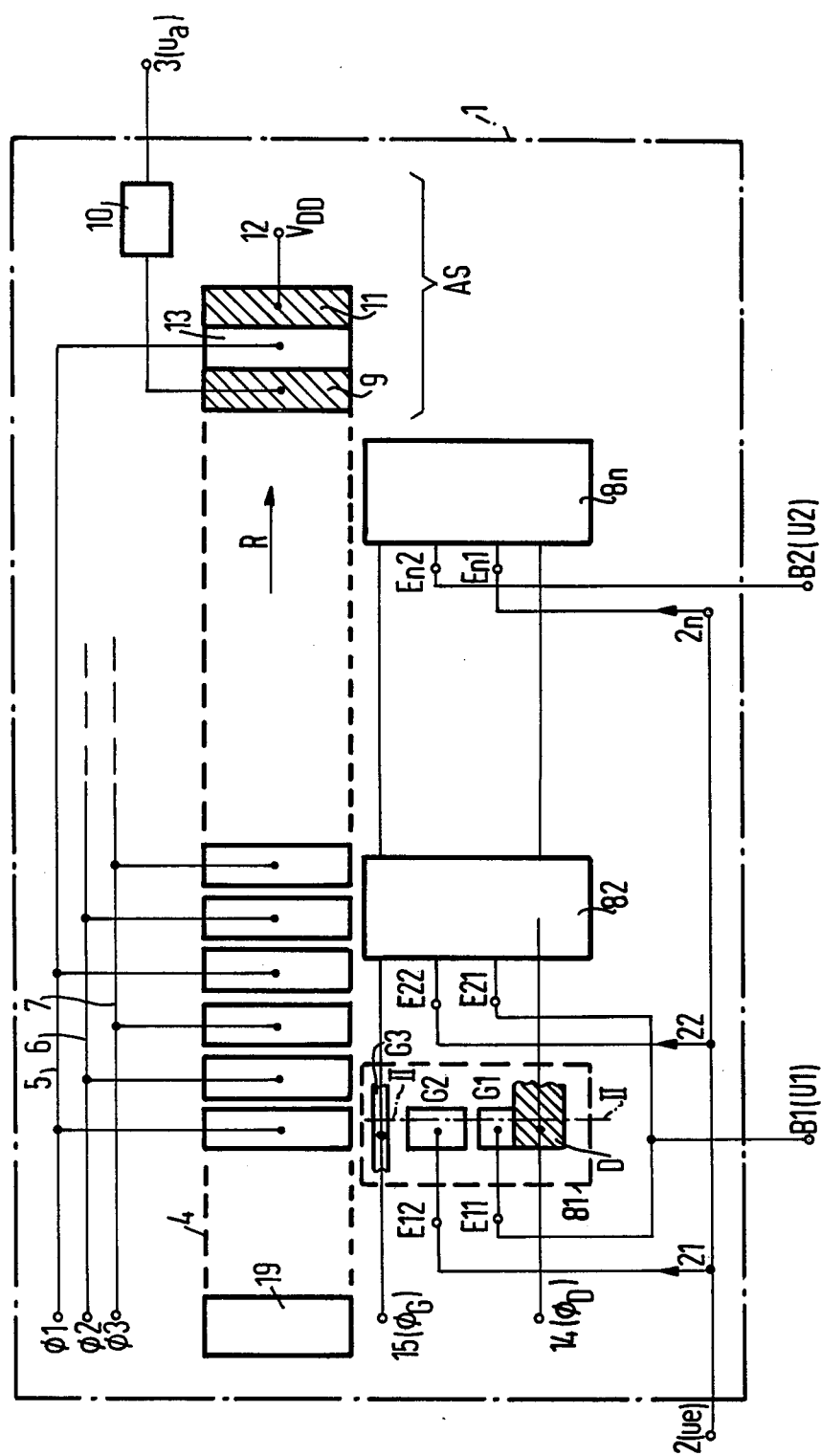
FIG. 1 is a basic schematic representation of the initially-mentioned, known transversal filter having a CCD shift register with parallel inputs and a series output.

The transversal filters schematically illustrated in FIG. 1 is designed as a monolithically integrated semiconductor circuit on a doped semiconductor substrate 1, for example p-conductive silicon. An analog input signal $u_e$ is supplied to a terminal 2, whereas an analog output signal $u_a$ can be taken off at an output 3, whose temporal course corresponds to that of the signal $u_e$ after the same has traversed a frequency filter having a specific frequency characteristic. The frequency characteristic, for example, can be that of a low-pass filter. A shift register 4 is designed as a charge coupled device (CCD) and functions in three-phase operation. The shift register has a series of electrodes 411, 412, 413, 422, 423, etc. which are placed in close proximity in the shift direction R over a thin insulating layer, for example, a gate oxide layer of $SiO_2$ covering the substrate 1.

Three respective electrodes lying adjacent one another, for example, 411, 412 and 413 or 421, 422 and 423, belong to a shift register stage, whereby the first electrodes 411, 421, etc. of all stages are connected to a line 5 and are connected by way of this line with a shift pulse voltage $\phi_1$, whereas the second electrodes 412, 422, etc. are connected to a common line 6 and by way of the line 6 are connected with a shift pulse voltage $\phi_2$ and the third electrodes 413, 423, etc. are connected to a line 7 which receives a shift pulse voltage $\phi_3$. In a temporal course of operation of the voltages $\phi_1$–$\phi_3$, according to FIG. 3, below each third electrode, local maximums of the surface potential $\phi_s$ in the semiconductor substrate 1, so-called potential wells, ensue which are displaced step-by-step from stage-to-stage in the direction R in the sequence of the clock pulses of the voltages $\phi_1$–$\phi_3$. If one now injects electrical charges into these potential wells respectively surrounded by space charge regions, which exhibit a polarity which corresponds to that of the minority carriers of the substrate 1, these are displaced along with the potential wells and can, after passing through the entire shift register 4, be read out time-delayed in the output stage AS. In the embodiment of the shift register 4 illustrated in FIG. 1, the output stage AS contains a diffusion area 9 (floating diffusion output) temporarily switched free of external potentials. This area is conductively connected with the output 3 by way of an output amplifier 10. The area 9, together with a second diffusion area 11 which is connected with a drain voltage $V_{DD}$ by way of a connection 12 and a gate electrode 13 which is connected at the shift pulse voltage $\phi_1$ by way of the line 5, represents a field effect transistor which, upon occurrence of the individual voltage pulses $\phi_1$, intermittently applies a reference potential to the area 9.

The input 2 of the transversal filter is connected to a series of parallel inputs 21, 22, 2n which are respectively assigned to the individual stages of the shift register 4. Each of the parallel inputs is provided with an evaluation circuit 81, 82, 8n. The evaluation circuits respectively exhibit an area D oppositely doped with respect to the substrate 1, a first input gate G1, a second input gate G2 and a transfer gate G3, whereby the areas D of all evaluation circuits 81-8n are designed contiguously and are connected to a connection 14, whereas the transfer gate electrodes G3 of all evaluation circuits are likewise designed contiguously and are provided with a connection 15. The first input gate G1 of the evaluation circuit 81 is provided with a connection E11, while the gate G2 is provided with a connection E12. The corresponding connections of the evaluation circuit 82 are indicated at E21 and E22, while those of the last evaluation circuit 8n are indicated at En1 and En2. In FIG. 1, the connections E11, E21 and En1 are respectively connected to the parallel inputs 21, 22 and 2n, whereas the connections E11 and E21 are connected to a common connection B1 and the connection En2 is connected to a connection B2.

Figure 2:
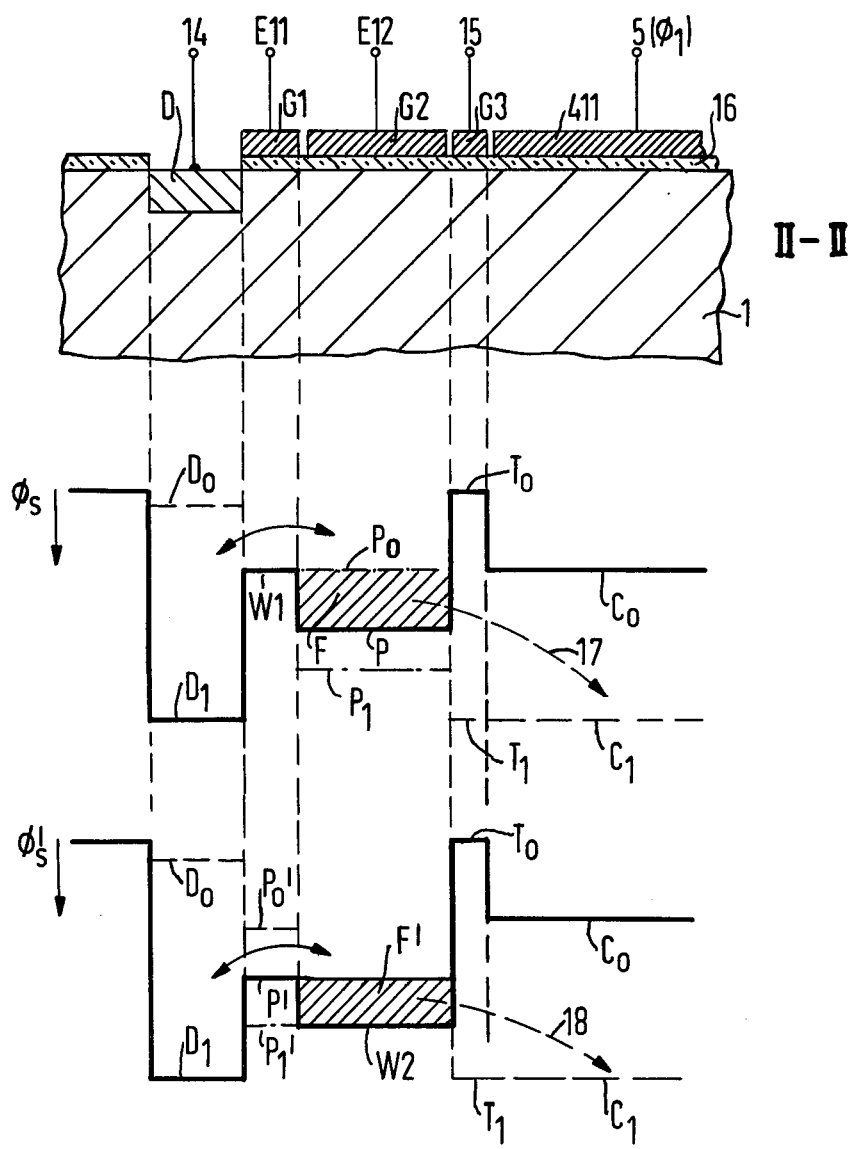
FIG. 2 is a cross-sectional view taken through a portion of the circuit illustrated in FIG. 1.

In FIG. 2, the evaluation circuit 81 is illustrated, in section, as viewed along the line II—II. In FIG. 2 the parts already shown in FIG. 1 have been provided with the same reference characters. The thin insulation layer on which the portions G1, G2, G3 and 411 are located is referenced 16. The evaluation circuit 81 is arranged for a positive evaluation coefficient. Thereby, a constant direct voltage U1 is supplied to the connection E11 of the first input gate G1 by way of the connection B1, which is at most as large as the smallest input signal $u_e$ to be evaluated, so that a fixed potential threshold W1 occurs for the surface potential $\phi_s$ beneath the element G1. The input signal $u_e$ is supplied to the connection E12 by way of the parallel input 21, whereby the potential values between $P_1$ (for the maximum signal $u_e$) and $P_0$ (for the minimum signal $u_e$) occur below the element G2.

Under the influence of the clock pulse voltages $\phi_G$ and $\phi_D$ illustrated in FIG. 3, which are respectively supplied to the connections 14 and 15, potential values $D_1$ or, respectively, $D_0$ and $T_1$ or, respectively, $T_0$ occur within the doped area D and below the transfer gate G3 according to FIG. 2. At the time $t_0$ (FIG. 3) a potential difference $D_0$, $W_1$, P, $T_0$ and $C_0$ exists, whereby the potential value P is provided by means of the magnitude of the input signal $u_e$ presently occurring. Thereby, the potential well formed beneath the gate G2 is flooded with charge carriers. At the time $t_1$, the potential $D_0$ has changed into the potential $D_1$, whereby the charge carriers again flow out of the area below the electrodes G1 and G2 into the area D to such a degree that the potential well formed below the electrode G2 remains filled only up to the edge provided by means of the potential W1, which is indicated in FIG. 2 by means of the shaded area F. When the potential $T_0$ has changed into the potential $T_1$ (time $t_2$), then the charge amount indicated by the shaded is displaced according to the arrow 17 beneath the electrode 411, since this is simultaneously occupied with a relatively high shift pulse voltage $\phi_1$, which produces a potential value $C_1$. It is significant that in a design of the circuit 81 for a positive evaluation coefficient, upon occurrence of the minimun input signal $u_e$ no amount of charge is read in because $P = P_0$; upon occurrence of the maximum input signal $u_e$ the maximum amount of charge which can be represented by means of the surface line between the potentials $P_0$ and $P_1$ is read in because $P = P_1$. The read-in process is repeated with the frequency of the shift pulse voltage $\phi_1$.

When an evaluation circuit, for example, the circuit $8n$ in FIG. 1 is designed for a negative evaluation coefficient, then the input signal $u_e$ is supplied to its first input gate by way of the connection En1 from a parallel input $2n$; whereas its second input gate is now occupied with a constant direct voltage U2 by way of a connection En2 and a connection B2, which is at least as large as the maximum input signal $u_e$ to be evaluated and produces a fixed potential value W2 below the gate G2. Potential values $P_1'$ for the maximum input signal and $P_0'$ for the minimum input signal $u_e$ then occur below the gate G1. Thereby, the filling of the potential well below the gate G2 is only possible up to the edge P'—indicated in FIG. 2 by means of the area F'—determined by means of the input signal $u_e$ occurring at the time $t_1$. After the change of potentials from $T_0$ to $T_1$ and $C_0$ to $C_1$ (time $t_2$), the amount of charge F' is again displaced beneath an electrode of the CCD shift register 4 (arrow 18). It is significant that, in the case of a negative evaluation coefficient, upon occurrence of the minimum input signal $u_e$, the maximum amount of charge is read in because $P' = P_0'$, which is illustrated in FIG. 2 by means of an area below the gate G2 and between the potential values $P_0'$ and $P_1'$; whereas, no amount of charge is read in for the maximum input signal $u_e$ because $P' = P_1'$. This read-in process, also, is repeated with the frequency of the shift pulse voltage $\phi_1$.

In the shift register 4, therefore, summing processes respectively occur beneath the electrodes 411, 421, etc. upon occurrence of the shift pulse voltages $\phi_1$, in which the amounts of charge F or F' input by way of the appertaining parallel inputs are added to the charge respectively displaced within the shift register 4. The amounts of charge accumulated in this manner by means of multiple summing operations, which finally arrive in succession at the last stage of the shift register 4, and then respectively effect potential shifts upon penetration into the diffusion area 9, previously brought to a reference potential, potential shifts are evaluated by way of the amplifier 10 and compounded to form the filtered output signal $u_a$.

Figure 3:
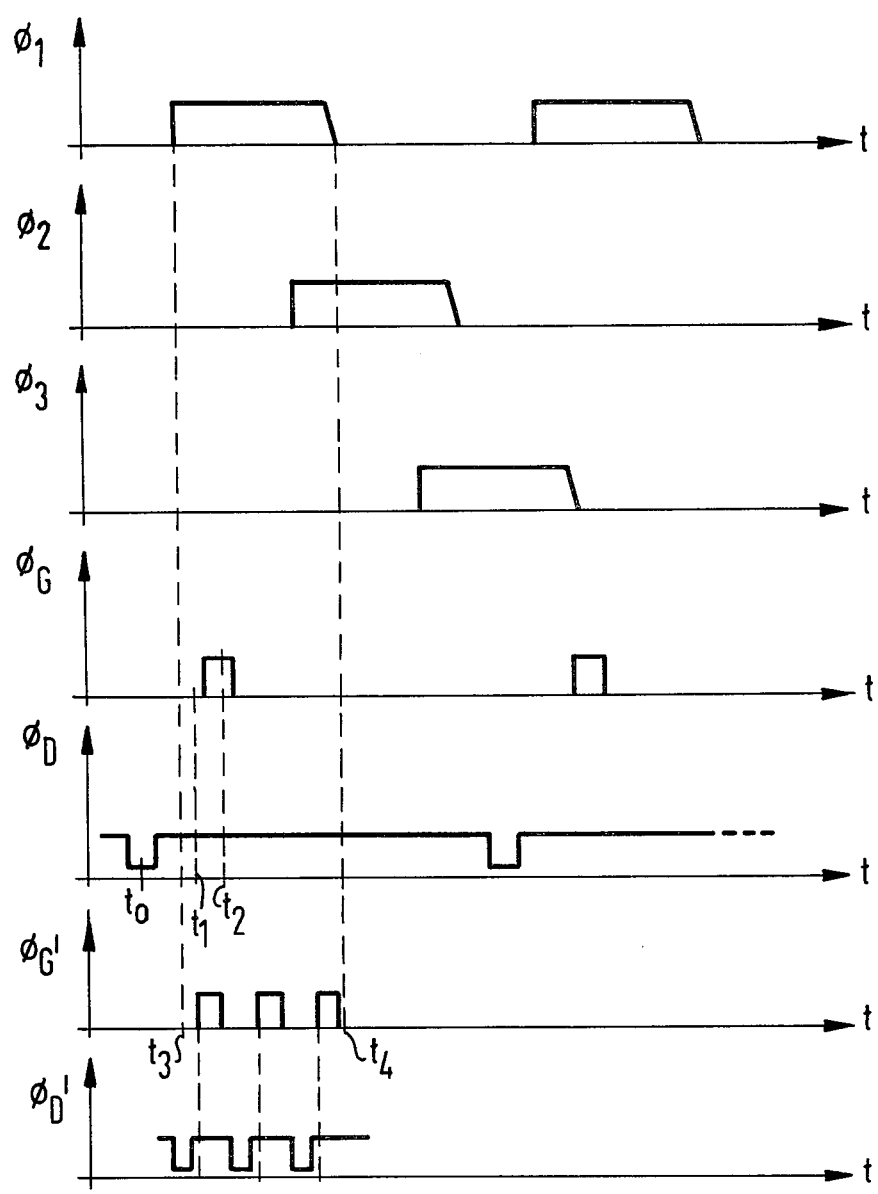
FIG. 3 is a timing diagram illustrating the operating voltages required for a transversal filter constructed in accordance with FIGS. 1 and 2.

By means of an input stage of the shift register 4, which is known per se and indicated at 19, which for example, is described by Sequin and Tompsett in their book "Charge Transfer Devices", Academic Press, New York, 1975, pp. 48–50, particularly FIG. 3.12(d), one can add a constant basic charge to the amounts of charge displaced by way of the shift register, the basic charge also being designated as a "flat zero" in such literature. Hereby, the signal supplied to the input stage consists of a direct current.

Figure 4:
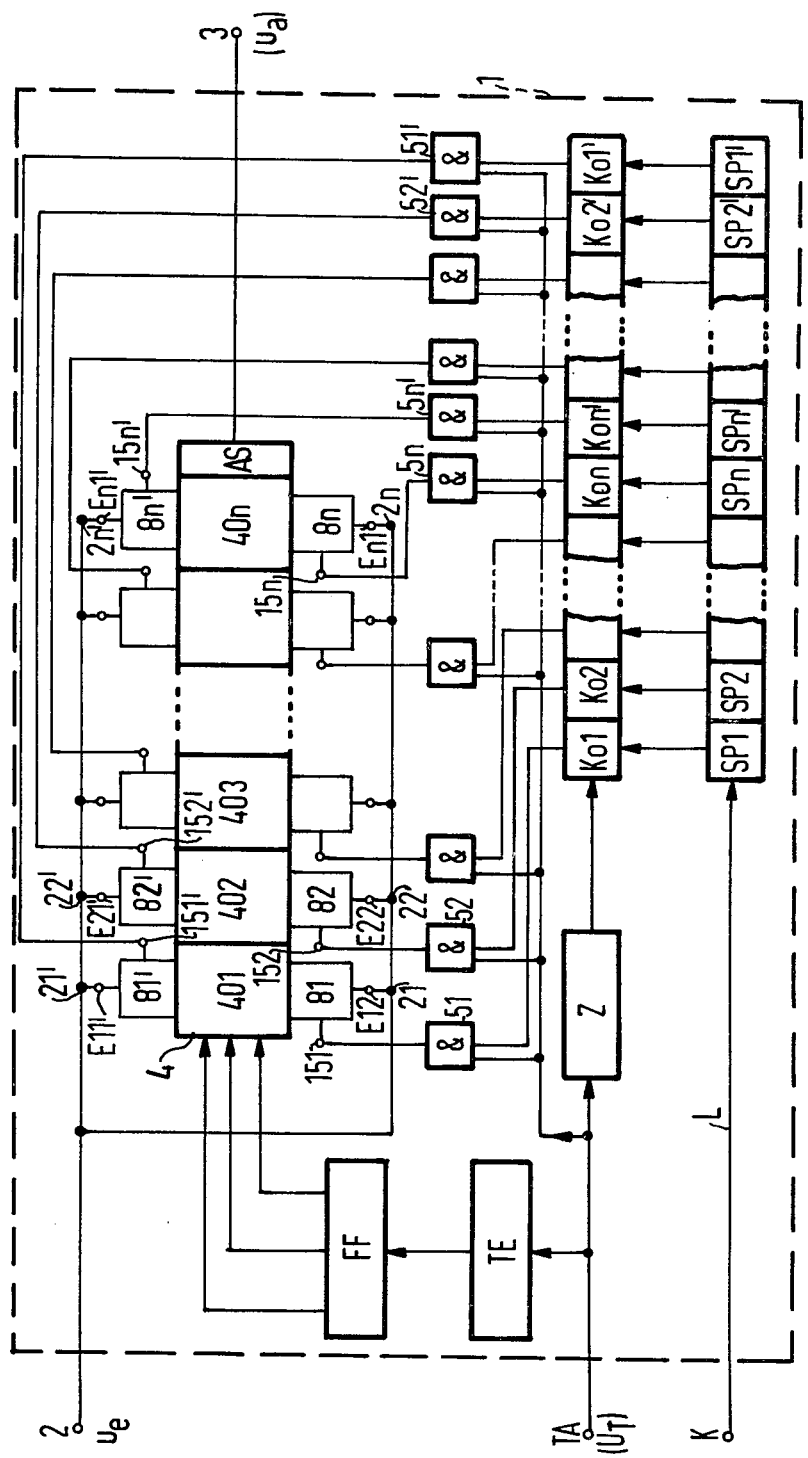
FIG. 4 is a schematic representation of a first exemplary embodiment of the present invention.

In FIG. 4, a transversal filter constructed in accordance with the present invention is schematically illustrated. The portions of such a filter already described with respect to FIGS. 1–3 are provided with the same reference characters in FIG. 4. In general, however, the shift register 4 can comprise one of the devices, known per se, comprehended under the term charge transfer devices (CTD) as they are described, for example, by Sequin and Tompsett, Supra at pp. 1–18. Thereby, such a charge transfer device can, corresponding to its design, function in two-phase, three-phase or four-phase operation. The individual stages of the shift register are illustrated in FIG. 4 as blocks 401, 402 . . . 40$n$. The output stage AS is illustrated, whereas the input stage 19 of FIG. 1 has been omitted for the sake of greater clarity. The input signal $u_e$ supplied by way of the connection 2 is adjacent to the parallel inputs 21, 22 . . . $2n$ of the shift register 4 and, further, to the connections E12 and E22 of the evaluation circuits 81 and 82, as well as to the connection En1 of the evaluation circuit $8n$. Thereby, the input signal $u_e$ is respectively connected to the second input gate G2 of the circuits 81 and 82, whereas the first input gate G1 of these circuits is respectively connected with a constant direct voltage U1 which is, at most, as large as the smallest signal $u_e$. In the case of the evaluation circuit $8n$, the input signal $u_e$ is fed to the first input gate G1, whereas the second input gate G2 is connected to a constant direct voltage U2 which is at least as large as the largest signal $u_e$. Therefore, it is readily apparent, that the evaluation circuits 81 and 82 are constructed for a positive evaluation coefficient, whereas the circuit $8n$, on the contrary, is designed for a negative evaluation coefficient.

The evaluation circuits 81, 82 . . . $8n$ are provided with connections 151, 152 . . . 15$n$, to which the clock pulse voltages for the individual transfer gate electrodes G3 are respectively and separately fed. Thereby, these clock pulse voltages are respectively derived by way of a series of AND gates 51, 52 . . . 5$n$ from a clock pulse voltage supplied by way of a terminal TA, the first inputs of the gate being respectively connected to the terminal TA and the outputs of the gates being connected with the connections 151, 152 . . . 15$n$. The second inputs of the AND gates are connected with the outputs of a plurality of comparators Ko1, Ko2 . . . Ko$n$. The first inputs of all comparators Ko1–Ko$n$, further, are connected to the output of a counter C, whose input is connected to the terminal TA. The second inputs of the comparators are connected with the outputs of a series of digital memories SP1–SP$n$, whose input lines L are connected to an input K.

First of all, by way of the input K and the input line L of the first digital memory SP1, a number in the form of a digital signal is input into the memory. After the resetting of the counter Z, the counter beings to count the pulses of the clock pulse voltage $U_T$ applied to the terminal TA. The comparator Ko1, which compares the digital signal stored in the memory SP1 with the output signal of the counter Z, in turn delivers an output signal opening the AND gate 51 only until the counter output signal or, respectively, the respective counter reading thereby expressed, reaches or exceeds the digital signal in the memory SP1. Therefore, the clock pulse voltage $U_T$ is supplied from a time $t_3$ of the resetting of the counter Z to the connection 151 of the evaluation circuit 81 as a clock pulse voltage $\phi_{G'}$ (FIG. 3) by way of the opened AND gate 51 until, at a time $t_4$, the number stored in the memory SP in the illustrated case the number 3, is reached or, respectively, exceeded by the output of the counter. Beginning at the time $t_4$, the AND circuit 51 is then blocked. Between the times $t_3$ and $t_4$, for each pulse $\phi_{G'}$ upon delivery of a further clock pulse $\phi_{D'}$ to the oppositely doped area D of the evaluation circuit 81, which pulse is derived from the clock pulse voltage $\phi_{G'}$ by way of an inverter and a time delay device, a specific amount of charge F (FIG. 2) is formed beneath the gate G2 and is displaced according to the arrow 17 beneath a shift electrode of the stage

401. The amount of the evaluation coefficient allocated to the parallel input 21 derives from the plurality of charge amounts F read in during the interval $t_3$ through $t_4$; its operational sign is derived from a drive of the evaluation circuit 81. Therefore, by means of the selection of the number stored in the memory SP1, which can also be multi-digital, it can be accurately determined how often the amount of charge F, which is proportional to the respectively adjacent amplitude of the input signal $u_e$, is read into the stage 401 by way of the input 21. However, the repetition rate of the voltage pulse $\phi_{G'}$ or, respectively, of $U_T$ must be significantly higher than the repetition rate of the shift pulse voltage $\phi_1$. The high repetition rate of the voltage $U_T$ is reduced to the value required for the shift pulse voltage $\phi_1$ by means of a frequency divider TE, whereby the voltages $\phi_1-\phi_3$ are derived from the divided clock pulse voltage $U_T$ by way of a flip-flop circuit FF.

Independently from one another, the further digital memories SP2–SPn can have other digital signals supplied thereto, whereby the input numerical values undertake a blocking of the inputs 152–15n by way of the comparators Ko2–Kon and the AND gates 52–5n in the same manner, as soon as the counter reading has respectively reached or exceeded the individual numbers. When, for example, one feeds the parallel input 2n to the input En2 of the evaluation circuit 8n and simultaneously applies a constant direct voltage U1 to the input En1, the operational sign of the evaluation coefficient is positive for the evaluation circuit 8n also. On the other hand, each of the evaluation circuits 81, 82 or one of the further evaluation circuits can be constructed for negative operational signs by means of the delivery of the input signals $u_e$ to the respective first gate electrode G1 and the simultaneous delivery of U2 to the gate electrode G2.

According to a further development of the invention, additional parallel inputs 21', 22' . . . 2n' are provided which, by way of the assigned evaluation circuits 81', 82' . . . 8n', render possible a charge input at the same stages of the shift register 4 as the parallel inputs 21, 22 . . . 2n; however, respectively on the opposite side of the transfer channel of the shift register 4. Thereby, two inputs lying opposite one another, for example, 21 and 21', must respectively exhibit evaluation circuits, for example 81 and 81', which are constructed for the same operational sign.

Another further development of the invention provides that the evaluation circuits 81–8n are all constructed for a positive evaluation coefficient, whereas the evaluation circuits 81'–8n' are all constructed for a negative evaluation coefficient. In this case, the operational sign of the individual evaluation coefficients is electrically programmable. This occurs in that, of two parallel inputs lying respectively opposite one another, for example, the inputs 21 and 21', the evaluation circuit of one, for example the evaluation circuit 81', is constantly blocked at its one clock pulse voltage input, for example the input 151', which one achieves by means of the input of the number "0" into the assigned memory, for example the memory SP1'. With this technique, only one of the two parallel inputs lying opposite one another is effective and determines the operational sign of the evaluation coefficient assigned to the respective shift register stage by means of its circuit conditions. In this manner, the operational signs of the evaluation coefficients for the individual stages 401, 402 . . . 40n can be selected independently of each other.

According to a preferred further development of the invention, the individual digital memories SP1–SPn and, if necessary, SP1'–SPn' comprise the stages of a static shift register in which the stored information need not be regenerated. Thereby, the input of all numbers to be stored takes place in succession in the sequence of the stages SP1', SP2' by way of the input K and the input line L.

Figure 5:
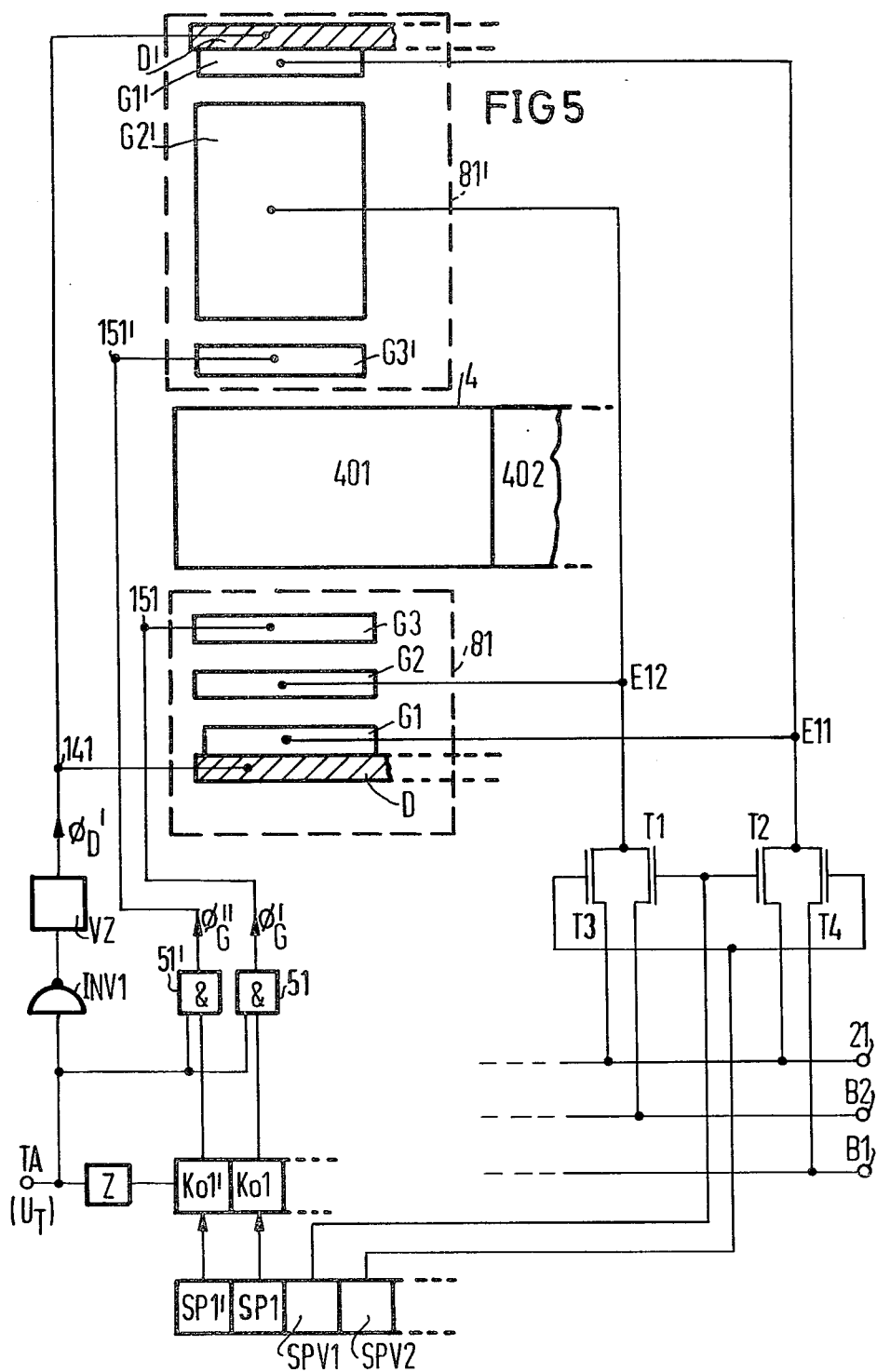
FIG. 5 is a schematic representation of a second examplary embodiment of the present invention.

In FIG. 5, another exemplary embodiment of the invention is schematically illustrated, in which the evaluation circuits 81 and 81' which are on opposite sides of the transfer channel in the first stage 401 are provided with the elements D, G1, G2 and G3, and, respectively, D', G1', G2' and G3' which have already been described with respect to FIGS. 1–4. The first input gate electrodes G1 and G1' are connected to a common connection E11, the second input gate electrodes G2 and G2' are connected to a common connection E12. Thereby, upon the supply of the input signal $u_e$ from the parallel input 21 to the connection E12 and upon simultaneous supply of the voltage U1 to the connection E11, both evaluation circuits respond to provide a positive evaluation coefficient; whereas, upon supplying the input signal $u_e$ to the connection E11 and the simultaneous application of a direct voltage U2 on the connection E12, the same circuits are conditioned to produce a negative operational sign.

The aforementioned two possibilities for the control of connections E11 and E12 are achieved by means of two further digital memories SPV1 and SPV2, which can again be designed as stages of a static shift register described above with respect to FIG. 4. The output of the digital memory SPV1 is connected to the gate electrodes of two field effect transistors T1 and T2; the output of the digital memory SPV2 is connected with the gate electrodes of two further field effect transistors T3 and T4. The source-drain path of the transistor T2 is connected between the connection 21 and the connection E11, the source-drain path of the transistor T3 is connected between the connection 21 and the connection E12, the source-drain path of the transistor T1 is connected between the connection B2 and the connection E12, and the source-drain path of the transistor T4 is connected between the connection B1 and the connection E11. When one feeds a "0" into the memory SPV1 and a "1" into the memory SPV2 so that the output of the memory SPV2 is conductive and the output of the memory SPV1 is not, the transistors T3 and T4 are rendered conductive which represents a supply of the input signals $u_e$ to the connection E12 and a supply of the voltage U1 to the connection E11. Therefore, the circuit 81 is rendered operational for a positive evaluation coefficient, which is also true for the circuit 81'. When a "1" is fed into the memory SPV1, but a "0" is fed into the memory SPV2, then the input signal $u_e$ is applied to the connection E11 and the voltage U2 is applied to the connection E12. Thereby, a negative operational sign of the evaluation coefficients of the circuits 81 and 81' is attained.

The supply of the clock pulse voltages $\phi_{G'}$ and $\phi_{G''}$ which are provided for the transfer gate electrodes G3 of the circuits 81 and 81' to the inputs 151 and 151' is controlled in the manner described above with respect to FIG. 4 by way of the AND gates 51 and 51', the comparators Ko1 and Ko1', the digital memories SP1 and SP1' and a counter Z, whereby the counter Z and the first inputs of the AND gates 51 and 51' are again connected to the terminal TA at which a clock pulse voltage $U_T$ is applied. The clock pulse voltage $\phi_D$, supplied to the areas D and D' which are doped opposite to the substrate is also derived from the voltage $U_T$ by way of an inverter INV1 and a time delay device VZ.

As can be seen from FIG. 5, one can select the surface of the gate G2' significantly larger than the surface of the gate G2. With this relationship it is achieved that the read-in process which proceeds by way of the circuit 81' serves for a rough adjustment of the evaluation coefficient, whereas the read-in process by way of the circuit 81 produces an additional fine adjustment. Thereby, the amounts of charge respectively read in by way of the circuits 81' and 81 stand in the ratio of the surfaces of the gate G2' and the gate G2, whereby this ratio can preferably assume a value of 10 or 100. The plurality of the respectively read-in amounts of charge is determined by means of the digital numbers stored in the memories SP1 and SP1'. From the combination of both read-in processes, a rapid read-in is produced, even in the case of such coefficients whose amount is fixed by means of large digital numercial values.

Figure 6:
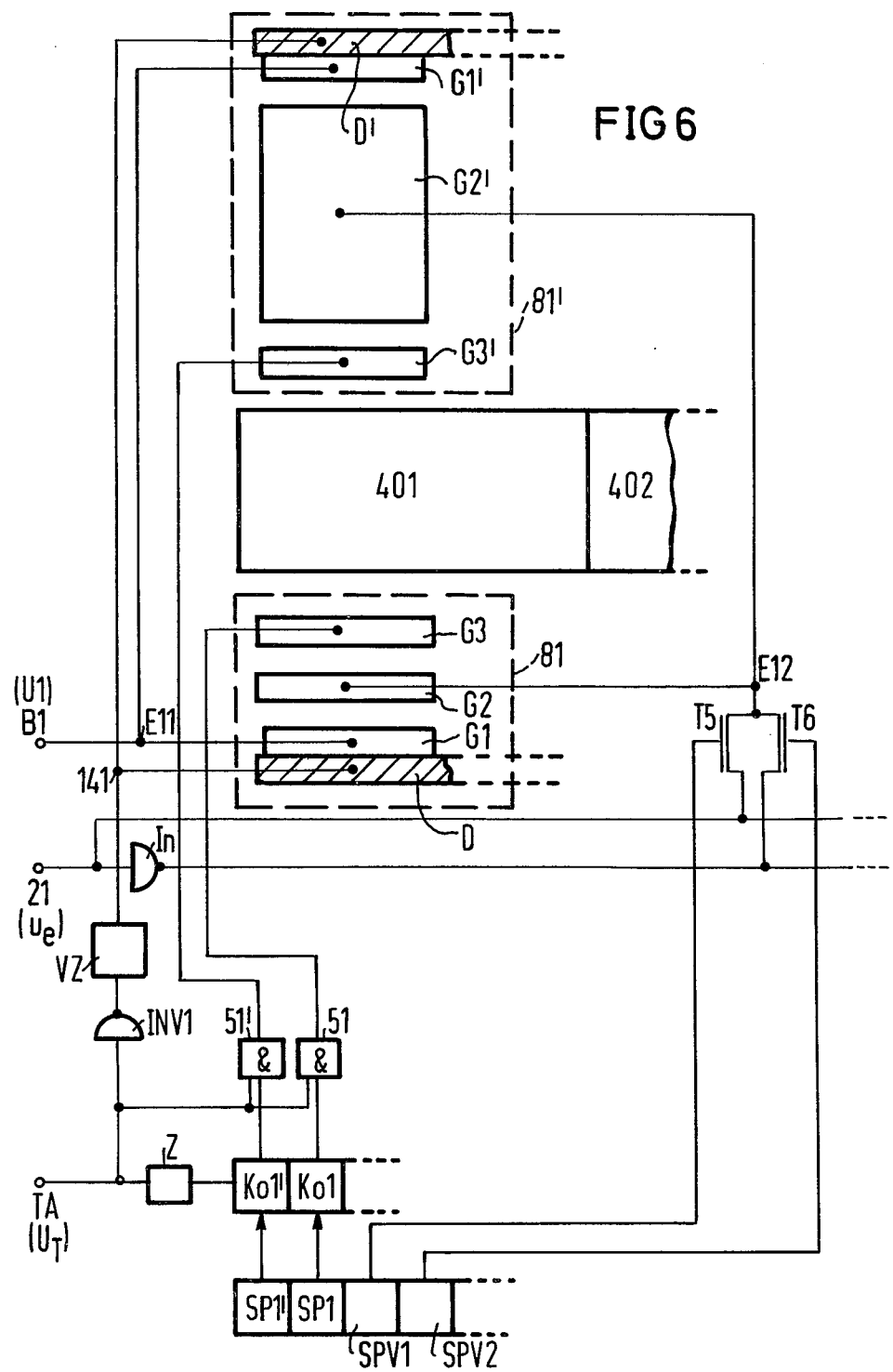
FIG. 6 is a schematic representation of a third exemplary embodiment of the invention.

The exemplary embodiment of the invention illustrated in FIG. 6 is different from that illustrated in FIG. 5 only by means of a different control of the common connections E11 and E12. In order to design the evaluation circuits 81 and 81' for a positive evaluation coefficient, which occurs by means of the supply of the input signal $u_e$ to the connection E12 and of U1 to the connection E11, a "1" is stored in the memory SPV1 and a "0" is stored in the memory SPV2, whereby a switching transistor T5 is controlled by way of the output of the memory SP1 to open and connect the parallel input 21 with the connection E12. A negative coefficient is set when a "0" is stored in the memory SPV1 and a "1" is stored in the memory SPV2. In this case, a switching transistor T6, whose source-drain path is connected, on the one hand, to the terminal 21 by way of an inverter In, and, on the other hand, to the connection E12, and which is controlled by way of the output of the memory SPV2 opens. Therefore, the inverted input signal $u_e$ is supplied to the connection E12, whereas the connection E11 has the potential U1 applied thereto.

In a departure from the previously-described principle of digital control of clock pulse voltages $\phi_{G'}$ and $\phi_{G''}$, which are supplied to the transfer gate electrodes, for example the electrodes $G_3$ and $G_{3'}$, from the circuits 81 and 81', of course, instead the clock pulse voltage is $\phi_{D'}$ supplied to the areas D and D' which are doped opposite to the substrate can also be digitally controlled. Thereby, then, the connections 151, 151', etc. of the transfer gate electrodes of the evaluation circuits 81, 81' etc. are directly connected to the terminal TA, whereas the doped areas D, D', etc. of the individual evaluation circuits are designed separated from one another and are respectively provided with their own connections. Individually assigned voltages $\phi_{D'}$ are then fed to these connections, the voltages $\phi_{D'}$ being derived from the connection TA by way of an inverter INV1 and a time delay device VZ, as well as by way of the respective AND gates 51, 51', etc. which are controlled by the comparators Ko1, Ko1', etc. and the memories SP1, SP1'. In this case, all of the transfer gate electrodes G3 of the evaluation circuits 81, 82, etc. are arranged on one side of the CTD transfer channel and can then be collected and comprised into a common transfer gate. A common clock pulse voltage $\phi_{G'}$ is then supplied thereto by way of a connection 151.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a transversal filter of the type in which an analog charge transfer device shift register is integrated on a doped semiconductor substrate and includes a plurality of stages which have parallel inputs for receiving an input signal and a plurality of evauation circuits connected thereto, each evaluation circuit including an area doped opposite to the substrate, first and second input gates and a transfer gate immediately adjacent the transfer channel of the charge transfer device shift register, one of the input gates connected to an input signal, the other input gate connected to a constant voltage and the oppositely doped area and the transfer gate respectively connected to receive first and second clock pulses from a clock, and in which the charge transfer device shift register includes an output, in combination therewith, the improvement comprising:

a counter connected to receive and operated by clock pulses from the clock, and including a plurality of outputs; a plurality of comparators each including first and second inputs and an output, the first inputs connected to said counter;

a plurality of gate circuits connected to the evaluation circuits; and a plurality of memories operable to provide a plurality of output signals at a plurality of outputs connected to respective inputs of said comparators, said outputs of said comparators connected to said gate circuits for causing blocking the evaluation circuits to one of the clock pulses as a function of the respective comparison results between said counter output signals and said memory output signals.

2. The improved transversal filter set forth in claim 1, wherein:

a first evaluation circuit is constructed for a positive evaluation coefficient and includes a first gate electrode adjacent the oppositely doped area connected to a direct voltage which is at most as large as the input signal to be evaluated, and a second gate electrode adjacent the transfer gate connected to receive the input signal.

3. The improved transversal filter set forth in claim 1, wherein:

an evaluation circuit is constructed for a positive evaluation coefficient and includes a first input gate electrode adjacent the oppositely doped area connected to receive the input signal, and a second input gate electrode adjacent the transfer channel and connected to a direct voltage which is at least as large as the input signal to be evaluated.

4. The improved transversal filter set forth in claim 1, comprising:

an inverter connected to receive and invert the input signal; and wherein an evaluation circuit is constructed for a negative evaluation coefficient and includes a first gate electrode adjacent the oppositely doped area and connected to a direct voltage which is at most as large as the input signal to be evaluated, and a second gate electrode adjacent the transfer channel and connected to said inverter to receive the inverted input signal.

5. The improved transversal filter set forth in claim 1, wherein:
at least one of the stages of the charge transfer device shift register includes a second input connected to the respective mentioned input of that stage; and comprising
an additional evaluation circuit connected to said second input and constructed for the same operational sign of the respective mentioned evaluation circuit of that stage.

6. The improved transversal filter set forth in claim 1, wherein:
at least one stage of said charge transfer device shift register has at least two of the evaluation circuits connected thereto, each of these evaluation circuits connected to receive the input signal;
one of these evaluation circuits constructed for a positive evaluation coefficient and the other constructed for a negative evaluation coefficient;
and wherein one of said memories feeds a "0" to a selected evaluation circuit of these two evaluation circuits via the respective comparator.

7. The improved transversal filter set forth in claim 1, wherein a stage of the charge transfer device shift register includes two inputs which are positioned opposite one another with respect to the transfer channel.

8. The improved transversal filter set forth in claim 1, wherein:
at least one of the stages of the charge transfer device shift register has a pair of the evaluation circuits disposed on opposite sides of the transfer channel; and
each of these evaluation circuits include a gate electrode which is of a different size than the corresponding gate electrode of the other.

9. The improved transversal filter set forth in claim 1, wherein:
at least one of the stages of the charge transfer device shift register as a pair of the evaluation circuits on opposite sides thereof;
each of the pair of evaluation circuits includes first and second input gate electrodes; and further comprising:
a first common connection for said first input gate electrodes;
a second common connection for said second input gate electrodes;
a pair of additional memories; and
transistor means connected to said first and second common connections, on the one hand, and to the input signal, to a first constant voltage which is at most as large as the smallest input signal and to a second constant voltage which is at least as large as the largest input signal, said transistor means connected to and selectively operated by said memories.

10. The improved transversal filter set forth in claim 9, comprising:
an inverter for receiving the input signal, said inverter connected to said transistor means for providing the inverted input signal thereto.

11. The improved transversal filter set forth in claim 10, wherein said memories are constructed as stages as a static shift register.

12. The improved transversal filter set forth in claim 11, wherein said transversal filter is constructed as a semiconductor circuit monolithically integrated on a semiconductor substrate.

* * * * *